Nov. 27, 1962 W. J. BORNEMANN ETAL 3,065,681

MASTER PATTERN PRINTER

Filed July 17, 1959

3 Sheets-Sheet 1

INVENTORS
WILLIAM J. BORNEMANN,
WILLIAM H. SENIOR AND
FRED J. WOCHNER

BY F. H. Henson
ATTORNEY

INVENTORS
WILLIAM J. BORNEMANN,
WILLIAM H. SENIOR AND
FRED J. WOCHNER

BY F. H. Henson
ATTORNEY

Nov. 27, 1962

W. J. BORNEMANN ETAL 3,065,681

MASTER PATTERN PRINTER

Filed July 17, 1959

3 Sheets-Sheet 3

*INVENTORS*
WILLIAM J. BORNEMANN,
WILLIAM H. SENIOR AND
FRED J. WOCHNER

*BY* F. H. Henson
ATTORNEY

United States Patent Office
3,065,681
Patented Nov. 27, 1962

3,065,681
MASTER PATTERN PRINTER

William John Bornemann, Webster, William H. Senior, Ontario, and Fred J. Wochner, Rochester, N.Y., assignors to General Dynamics Corporation, Rochester, N.Y., a corporation of Delaware Filed July 17, 1959, Ser. No. 827,940
8 Claims. (Cl. 95—1)

This invention relates to an improved process that is useful in the production of printed wiring cards, and to apparatus for practicing this process. The invention relates particularly to an improved method for preparing the "artwork" for printed wiring cards.

The introduction of printed circuitry has permitted great economies in the production of electrical and electronic equipment. Many technological advances have been made, in recent years, in the mass production of printed wiring cards that can be assembled with circuit components for use in electronic and electrical devices, to take full advantage of the potentialities of the printed wiring concept.

The first step in preparing for the mass production of a printed wiring card, by the usual etching process, is the preparation of a circuit-pattern drawing or "artwork," usually on an enlarged scale. This artwork depicts a pattern of metallic conductors, including lands, interconnection paths, contact pads and the like, that is desired for a particular printed wiring card. The artwork usually is drawn in black ink on a dimensionally stable base. Black masking tape is often employed for parts of the drawing, instead of black ink. The artwork must provide a high contrast reproduction of the circuit pattern that is desired, so that it will photograph well.

A step and repeat negative is prepared from this artwork, to use in the manufacturing of the printed wiring cards. This consists of the photographic negative of the artwork, repeated on a photographic film in a regular pattern, with just sufficient space between the rows of circuit reproductions on the plate to permit cutting and blanking out of the individual circuits, when the step and repeat negative is reproduced on card stock. After reproduction of the step and repeat negative on the copper surface of a copper-clad plastic insulating base, to form a resist coating, the base is placed in an etching bath to remove the unwanted portions of the metal. After etching, the base is cleaned and dried, and it is then ready for fabrication and assembly.

These manufacturing procedures are highly mechanized and can be carried out by skilled personnel with a minimum amount of training. Since the manufacturing steps are mechanical, there is relatively little chance for error. However, the lands and the interconnection paths or highways, that are etched on the surface of the plastic base, are only as clear, clean, and well defined as the circuit-pattern drawing from which the reproduction on the base is made. For that reason, that drawing is generally prepared by a skilled draftsman on the basis of a rough sketch that is provided by an engineer. The drawing ordinarily is executed on stable white board that provides the necessary contrast, for good photographic reproduction, with the black ink or black masking tape. In addition, the board possesses good dimensional stability. Usually, this drawing is made several times actual size of the circuit desired, to help compensate for the errors made by the draftsman. For example, if the draftsman makes an error in a drawing that is eight times actual size, when this drawing is photographically reduced, the error in the negative reproduction which is actual circuit size will only be one-eighth the size of the error made in preparing the artwork.

Two other drawings are presently required for each printed wiring assembly, in addition to the circuit-pattern drawing. These two drawings are the facsimile drawing and the assembly drawing.

The facsimile drawing is a representation of the desired printed pattern of metallic conductors on the base, with dimensions and drilling information added, to permit holes to be drilled in the base at proper locations for the insertion of the leads of circuit components. This drawing provides all of the necessary dimensions and drilling information required for an individual printed wiring card. Where a plurality of cards are desired, all identically dimensioned and punched with the same pattern of holes, a tool for punching the holes and blanking the panels can be designed on the basis of the facsimile drawing.

The assembly drawing is a representation of the complete circuit on the assembly side of the board. The assembly drawing shows the components such as resistors, transistors, and the like, actually mounted on the board, usually on the side opposite the printed wiring side.

The time and materials that are required for the preparation of these drawings add very considerably to the expense of converting circuit configurations into printed wiring assemblies. Moreover, the time that is required, and the services of the highly skilled personnel required, often represent a bottleneck in production.

Whereas the manufacturing processes have become highly mechanized and efficient, very little has been done in the past, by comparison, to facilitate and expedite the preparation of the artwork and facsimile drawing, and to minimize the errors that the human factor inevitably introduces into the artwork.

One object of the present invention is to provide a device that will reduce the engineering and drafting time that is required to convert a variety of circuit configurations into printed wiring assemblies.

Another object of the invention is to provide a process and apparatus for making the artwork for printed wiring cards that is easier and less expensive than methods that have hitherto been employed, yet that produces artwork of equal or superior clarity, cleanness, definition, and dimensional accuracy.

Another object of the invention is to provide a method and apparatus for making artwork for printed wiring cards that can be used by relatively unskilled personnel with a minimum amount of training, to conserve the time of highly skilled draftsmen.

A further object of the invention is to provide a machine that can be used to produce artwork for printed wiring cards at far greater speeds than is possible with existing systems, with greater dimensional accuracy, and with fewer, necessary photographic steps.

Another object of the invention is to provide a process for converting a variety of circuit configurations to printed wiring assemblies much faster and more accurately than has been possible in the past.

Still another object of the invention is to provide an apparatus and process for preparing the artwork for printed wiring cards, that will permit precise location of the holes and lands for a variety of circuit configurations, without the necessity for making painstakingly accurate measurements for each individual circuit configuration.

Other objects of the invention will be apparent hereinafter from the specification and from the recital of the appended claims.

Figure 1:
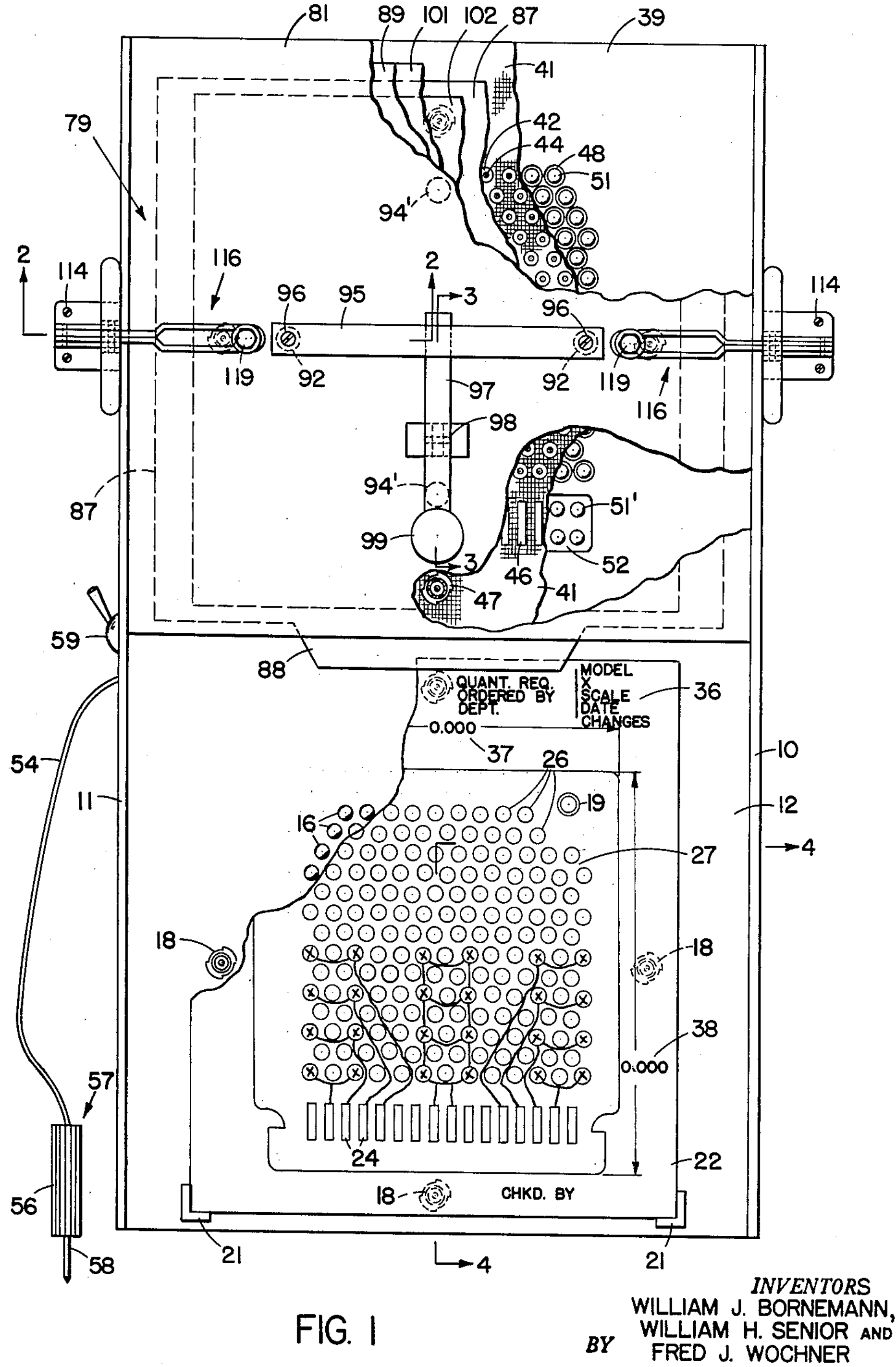
FIG. 1 is a top plan view, partly broken away, of an apparatus that is useful in preparing artwork for the mass production of printed wiring cards, and that is constructed in accordance with one embodiment of this invention.
Figure 8:
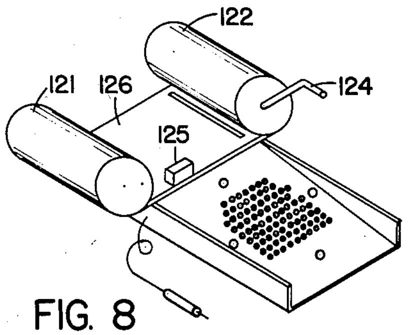
Figure 7:
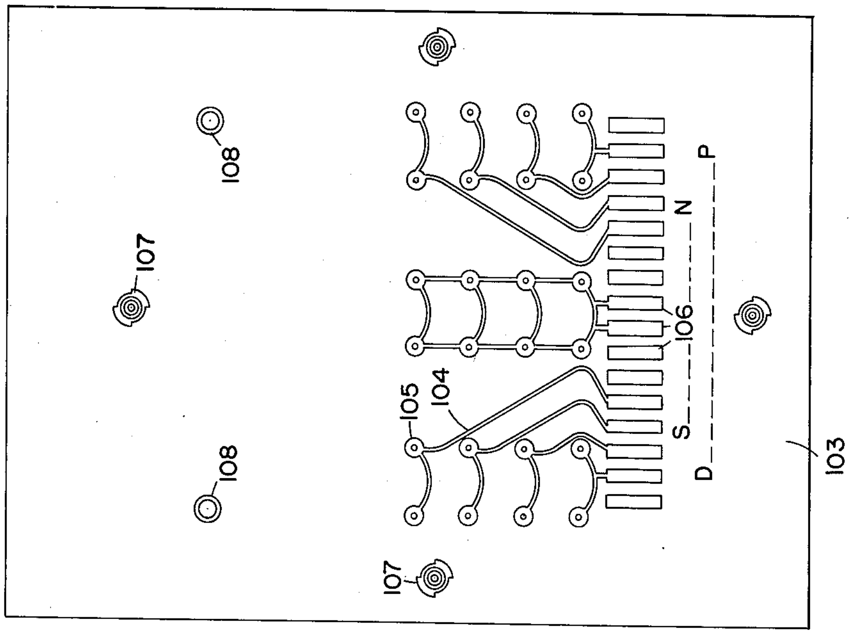

FIG. 7 is a top plan view of a positive reproduction that was made by applying, to the positive from the machine shown in FIG. 1, masking tape to represent the highways required for the printed wiring card, then reproducing that taped positive reproduction to obtain dimensionally accurate artwork that can be used to make the step and repeat negative, and FIG. 8 is a perspective view, on a reduced scale, of apparatus constructed in accordance with another embodiment of this invention.

In preparing a sketch for use by a draftsman for the preparation of artwork for a printed wiring card, an engineer may wish to prepare one or more possible circuit arrangements for comparison and study. To this end, according to our invention, inexpensive, mimeographed or printed sketch sheets are provided, each of which contains a reproduction of the outline of a printed wiring card, together with a standard pattern of contact pads, center lines, corner marks, and the like, and a predetermined pattern of holes and lands. The engineers can select, on a sketch sheet, from the printed standard pattern of holes and lands, the location of the holes and lands that are desired for a particular printed wiring card.

Preferably, the reproduction on the sketch sheet is several times actual size, to minimize errors. To use the sketch sheet, the engineer marks, preferably with colored pencil, those lands that are needed for the particular circuit configuration, and also marks the interconnection paths or highways that are required to interconnect the lands with each other and with the appropriate contact pads. To conserve the time of the engineer, the paths may be traced in very roughly, leaving it to later detail workers to plot the ultimate paths with greater accuracy.

To prepare artwork that is suitable for use in the mass production of a printed wiring card having the desired, selected lands and paths, and that can be used in the conventional photo-etch process, it is necessary to transfer the information that is available in rough form in the engineer's sketch sheet, to a dimensionally accurate reproduction, such as a photographic negative or positive, that has the contact pads, datum marks, lands, holes and paths, and the like, accurately positioned relative to each other and to the datum marks, as needed for the particular printed wiring card.

To accomplish this, we provide a machine that has two sections. In one section, a partial representation of a printed wiring card of a standard size and shape may be provided, on a flat plate that is made of an insulating material such as a synthetic plastic. A plurality of electrical contact buttons, that have substantially the same size, respectively, as the images of the lands on the sketch sheet, are disposed on this plate, and they are arranged in the same pattern as the circular lands on the sketch sheet, so that, if the sketch sheet is superposed on the pattern of buttons, the outlines of the lands on the sketch sheet will register with the pattern of buttons on the plate.

The second section of the machine is a photographic exposure apparatus. A plurality of incandescent lamps, or other light sources, are mounted in shielded relation to each other, so that each light source can illuminate a small, discrete area, by casting a directed beam of light.

An opaque mask is mounted over the light sources. This mask, according to the preferred embodiment of the invention, is a reverse negative of the standard layout that is also reproduced on the sketch sheet, and it is formed with a plurality of light-transmitting areas, that correspond reversely in their arrangement to the arrangement or pattern of the land outlines on the sketch sheet, and that register with the light sources respectively. We provide means for disposing a sensitive photographic film over the mask, to permit selective exposure of the film by selective actuation of the light sources, so that the photographic layer will be exposed in areas corresponding to areas in the mask and to those light sources, and only those light sources, that are energized.

The contact buttons in the first section of the machine are electrically connected to the corresponding light sources, respectively, in the second section of the macine. The light sources in turn are connected in common to a stylus, that has a sharp pointed end. To use the apparatus to expose a photographic film, to obtain a reproduction of desired land areas in predetermined positions relative to each other, the engineer's sketch sheet is superposed on the pattern of contact buttons, with the outlines of the land areas on the sketch sheet in registry with the corresponding contact buttons of the machine. Wherever the engineer has marked a land area on the sketch sheet, to indicate that it is desired for a particular printed wiring card, the stylus is employed to puncture the sketch sheet, to complete an electrical circuit from the stylus, through the contact button, to the corresponding light source in the other section of the machine, to energize the light source and to expose selectively the film that is superposed on the mask, by permitting the light to shine from the selected light source through the corresponding associated light transmitting area of the mask.

Preferably, all of the contact pads and datum marks, that are standard for all cards, and that are reproduced in the mask as light transmitting areas, have light sources associated with these areas of the mask that are adapted to be energized by a single switch that is separate from the stylus. To expose a film for the standard contact pads and datum marks that must be used on all printed wiring cards, then, it is merely necessary to throw a single switch.

Figure 4:
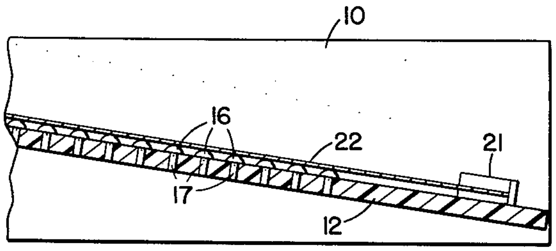
FIG. 4 is a fragmentary section on an enlarged scale, taken on the line 4—4 of FIG. 1, looking in the direction of the arrows.

Referring now in detail to the drawings by numerals of reference, 10, 11 denote respectively the upright side walls that extend from the front to the back of our apparatus. A plate 12 (FIGS. 1, 4) that is made of a synthetic plastic, electrical insulating material, is mounted between the two walls, and extends from the front of the apparatus approximately half-way to the rear. The plate 12 is inclined upwardly from the front toward the rear, and terminates at a point that is below the upper ends of the walls. A plurality of brass contact buttons 16 (FIGS. 1 and 4) are mounted on the upper surface of the plate 12 in accordance with a standard pattern that corresponds to some preselected arrangement for the geometrical relationships and spacing between holes and lands on a standard printed wiring card, the buttons corresponding to the lands, and the holes being centered in the lands and substantially coaxial therewith. Each contact button 16 is formed with a shank 17 (FIG. 4) that projects through the thickness of the plate 12, for connection to electrical wiring (not shown) at the lower surface of the plate.

Four center line guide markers 18 are printed, embossed, or otherwise reproduced at each of the respective four sides of the pattern of buttons, preferably at the same relative distances from the buttons 16 as would be the markers on a step and repeat negative of the same size. Similarly, the reproductions of the pallet holes 19 are disposed on the upper surface of the plate 12, above and at each side, respectively, of the pattern of buttons 16.

A pair of corner stops 21 (FIGS. 1 and 4) are secured to the upper surface of the plate 12, and are adapted to receive and to position properly, over the contact buttons, the lower corners of the sketch sheet 22, that is placed on the upper surface of the plate 12 during use of the machine, as shown in FIG. 1. The sketch sheet 22 is a printed or mimeographed black line reproduction on thin white paper of a card having a standard layout. This standard layout includes several rectangular contact pads 24, that are arranged along, but spaced from, the bottom edge of the card; a plurality of circles 26 representing lands; and bare area 27.

The circles 26 are disposed according to a predetermined pattern, which is the same pattern that is used in mounting the contact buttons 16. Numerical indicia (not shown) may also be printed on the sketch sheet, to indicate arbitrary location numbers that can be assigned to the reproductions of the lands, to facilitate identification of particular lands on this sketch sheet and artwork, and, as well, on the printed wiring cards. Similarly, the reproduction 24 of the contact pads could be numbered, to facilitate identification of particular contact pads. A suitable heading 36 is printed at the top of the sketch sheet 22. The reproduced standard layout on the sketch sheet 22 also preferably includes a horizontal dimension 37 and a vertical dimension 38.

In the back section of the machine, a relatively thick, generally horizontally-extending plate 39, that is made of an opaque, synthetic plastic material, is mounted to extend between the two walls 10, 11, from the back end of the plate 12 to the back of the machine. An opaque mask 41 is cemented or otherwise secured over the upper surface of the plate 39.

Figure 6:
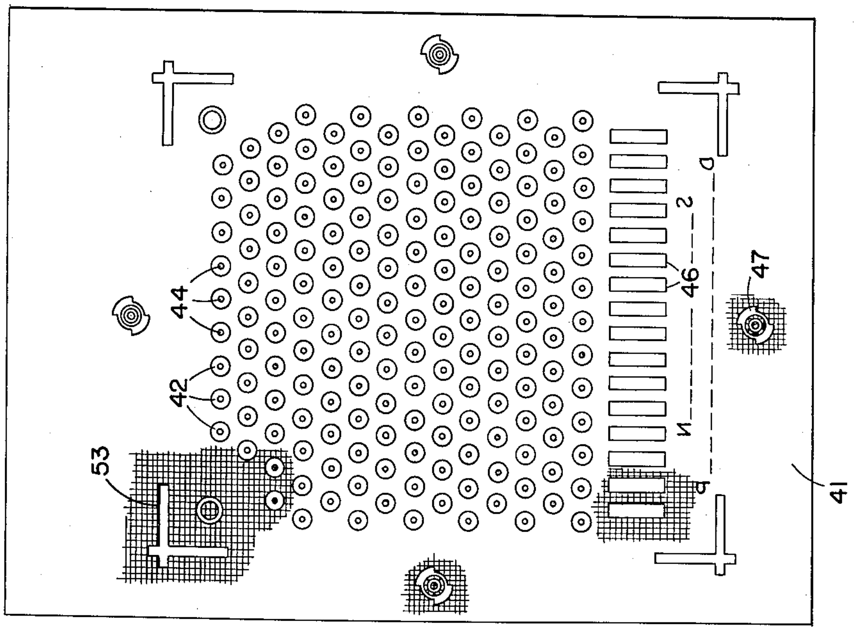
FIG. 6 is a top plan view of a reverse negative reproduction of a standard layout of circular lands, pilot holes, corner marks, center line marks, and identification indicia for a printed wiring card, produced in accordance with this invention.

The mask 41 is a dimensionally accurate reverse negative reproduction on dimensionally stable film of a standard pattern of circular lands, holes, contact pads, datum markers, pallet holes, center line markers, identifying indicia, and the like. The reproductions 42 of the circular lands in the opaque film 41 are transparent areas. The reproductions 44 of the holes are centered within the transparent land images 42, and are circular, opaque black dots. The mask 41 is also formed with transparent areas 46, representing the contact pads; with transparent areas 47, representing the center line markers; with transparent areas 53 (FIG. 6), representing datum or corner markers; and with other transparent areas representing images of standard pallet holes, identifying indicia and the like, that appear on every printed wiring card.

Figure 2:
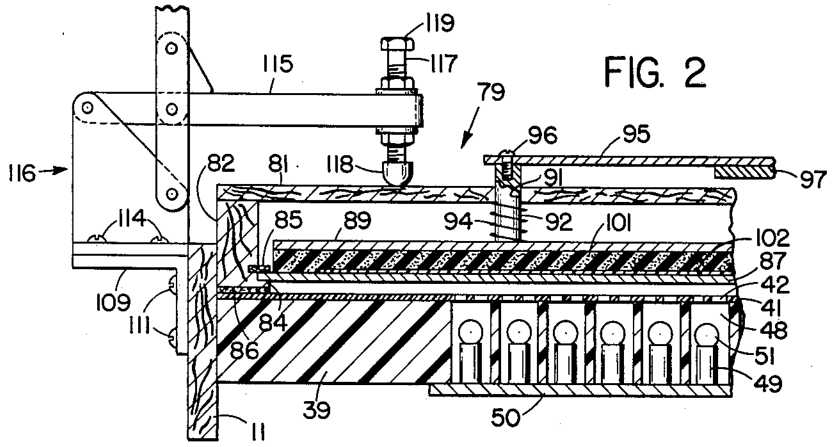
FIG. 2 is a fragmentary section, on an enlarged scale, taken on the line 2—2 of FIG. 1, looking in the direction of the arrows.

The plate 39 is formed with a plurality of generally cylindrical drilled holes 48 (FIGS. 1, 2). These holes are located in a predetermined pattern in which their axes are located at the intersections of a plurality of imaginary straight lines that intersect to form equilateral triangles. Sockets 49, for incandescent light bulbs, are mounted in each of the holes 48, on a board 50 that is secured to the lower surface of the plate 39. Light bulbs 51 are mounted in each of these sockets, respectively.

The holes 48 are so disposed in the plastic plate 39, and the sockets 49 are so mounted in the bores, that the centers of the bulbs 51 are aligned respectively with the centers of the transparent areas 42 that represent land images in the mask 41. Each hole 48 in the plastic plate 39 is, in effect, a chamber that is closed at one end by the mask 41, so that each incandescent bulb 51 is shielded from the other bulbs, and so that the light that one bulb 51 casts can escape from its chamber only in an upward direction through the transparent land image 42 in the mask 41.

The plastic plate 39 is also formed with openings that are disposed, respectively, beneath each transparent image area of the mask 41, and incandescent bulbs or other sources of light are mounted in the openings in such a way that the light that they cast can escape only through the transparent overlying areas of the mask 41. Thus, the plastic plate 39 is formed with an elongate slot 52 adjacent the front edge of the plate 39, and a plurality of incandescent light bulbs 51′ are mounted in sockets that are disposed in this slot. The slot 52 and the bulbs 51′, that are contained therein, are disposed beneath the transparent areas 46 in the mask 41 that form images of the contact pads. Since all of the contact pads are reproduced for every printed wiring card, there is no need to provide shielding between the incandescent bulbs 51′, and therefore a single slot can be used for mounting these incandescent bulbs and their sockets.

While the buttons 16 and the mask 41 and plate 39 are made to the same scale in the illustrated embodiment of the invention, it is contemplated that the buttons 16 can be arranged in a pattern that is on a different scale than that used in the mask 41 and plate 39.

A single flexible, electrically insulated conductor 54 is extended from beneath the front plate 12 through an aperture (not shown) in the wall 11, and is inserted within a bore in the handle grip 56 of a stylus that is generally denoted by the numeral 57. The stylus is formed with a sharp pointed metal rod 58 at one end thereof, and the conductor 54 is electrically connected to the rod 58. A single pole, single throw electrical switch 59 is mounted on the wall 11, preferably, as shown in FIG. 1, adjacent the location of the aperture through which the conductor 54 projects.

Figure 5:
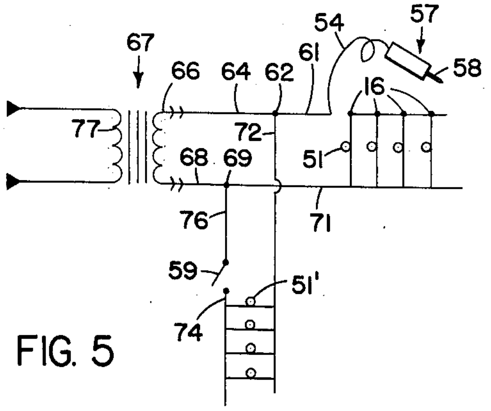
FIG. 5 is a schematic diagram, showing one way in which the apparatus of FIG. 1 can be wired, in order to accomplish its function.

As shown schematically in FIG. 5, the conductor 54 is connected to a line 61, that in turn is connected to a junction 62. The junction 62 is connected to a line 64 that is connected to one terminal of a secondary 66 of a power transformer 67. The other terminal of the power transformer secondary 66 is connected to a line 68. This line 68 is connected through a junction 69 to a line 71. One terminal of each filament of each of the incandescent lamps 51 is connected to the line 71, to connect the lamp filaments in parallel, to this line. The other terminal of each lamp filament is electrically connected to one of the contact buttons 16 on the front plate 12, that corresponds in location to the location of the filament of the bulb 51 to which it is connected.

A line 72 is connected to the junction 62. One filament terminal of each of the incandescent lamps 51′ is connected to the line 72, to connect the lamps 51′ in parallel. The other filament terminal of each of the lamps 51′ is connected to a line 74. The armature of the switch 59 is mounted to be moved in and out of electrical contact with the line 74. The armature of the switch 59 is connected to a line 76, that is electrically connected to the junction 69.

The primary coil 77 of the transformer 67 is electrically connected to a source of power (not shown).

A frame, that is generally indicated by the numeral 79, is provided to permit a sheet of photographic film to be disposed on the upper surface of the mask 41 and to be pressed into engagement therewith. The frame 79, as best shown in FIG. 2, comprises a top plate 81 that has four sidewalls 82 depending downwardly therefrom, to define a generally rectangular space therebetween. The two side walls and the rear wall are formed with inwardly extending lips 84, and the front wall 82 is foreshortened to provide a clearance above the upper surface of the lips 84. Rails 85 are mounted on the two side walls, above their lips 84, to provide a channel at each side of the frame. Preferably, a felt cushion 86 is disposed on the lower surface of the two side walls and the back wall, and their respective lips 84, to prevent scratching of the mask 41. An opaque shield 87 is formed with a front tab 88 that projects out from the front of the frame 79.

A plate 89 is disposed within the generally rectangular space between the four walls 82 of the frame 79. The top plate 81 of the frame is formed with a pair of apertures 91 (FIG. 2), and a pair of rods 92, that are secured at their lower ends to the plate 89, extend upwardly through the apertures 91 for sliding movement therein. A coil spring 94 is mounted about each of the rods 92, respectively, and is interposed between the plate 81 and the plate 89, constantly to urge these members apart. The rods 92 are connected at their upper ends to the opposite respective ends of a strap 95 by screws 96. Another pair of springs 94' (FIG. 1) are interposed between the two plates 81, 89 in spaced relation to the two springs 94, to balance the force that is applied, constantly to urge these two members apart.

Figure 3:
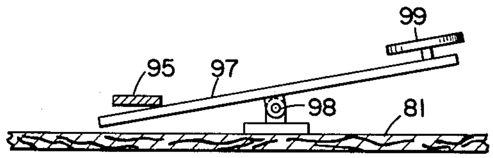
FIG. 3 is a fragmentary section, on an enlarged scale, taken on the line 3—3 of FIG. 1, looking in the direction of the arrows.

As best shown in FIG. 3, a lever 97 is mounted for pivotal movement about a pivot 98 that is supported above the upper surface of the top plate 81. One end of the lever 97 projects beneath the strap 95. A knob 99 is mounted on the other end of the lever 97.

A cushion 101 (FIG. 2) of foam rubber or a foamed resin is secured to the lower face of the plate 89. The cushion is formed with a smooth lower face. In preparation for use of the machine, the sensitive film 102 is interposed between the shield 87 and the lower surface of the film 101. Preferably, the film 102 is secured in place against the lower face of the film 101 by pressure sensitive tape (not shown).

Brackets 109 are secured to the side walls 10, 11 respectively by screws 111. To hold the frame 79 in place during use of the machine, a pair of toggle clamps, that are generally denoted by the numeral 116, are secured on the brackets 109 by fasteners 114. The clamps 116 are mounted for pivotal movement relative to their respective side walls 10, 11, as best shown in FIG. 2, to permit the clamps to be swung out of the way to permit the frame 79 to be moved into and out of place on the machine. Each of the clamps 116 are formed with an arm 115 that extends generally horizontally, about the top plate 81 of the frame, when its clamp is in its locked position, as shown in FIG. 2. A rod 117 is threaded through a bore that is formed in the free end of the rod 115. A cushioned foot 118 is secured to the lower end of the rod 117, and a knob 119 is secured to the upper end of the rod, to permit manual adjustment of the rod 117 up and down, to adjust the pressure of the foot 118 against the top plate 81 of the frame.

To use our machine to produce artwork for use in the mass production of printed wiring cards, the frame 79 is removed from the machine. Light sensitive film 102 is taped securely to the lower surface of the foam cushion 101, by easily removable, pressure sensitive tape, in a dark room. The knob 99 is then depressed, to move the lever 97 about its pivot 98, to lift the strap 95 away from the plate 81. The rods 92 are lifted up with the strap, thereby lifting the plate 89 up toward the plate 81, to compress the springs 94, 94'. The shield 87 is then inserted in the channels in the frame, between the upper surfaces of the lips 84 and the rails 85. Sufficient pressure is exerted continuously on the knob 99 so that the shield does not scrape against the light sensitive film as it is inserted in the frame. After the shield has been inserted in the frame, the knob 99 is released, and the springs 94, 94' expand to press the film 102 against the shield 87.

The frame 79 is then placed on the machine, and the clamps 116 are swung into position to press the frame 79 down firmly. After the clamps 116 are locked in position, the knob 99 is again pressed downwardly, to lift the film 102 away from the shield 87. The tab 88 of the shield 87 is then gripped and the shield is withdrawn from the frame. The knob 99 is released gradually as the shield 87 is withdrawn, to prevent any leakage of light into the frame. The springs 94, 94' expand, as the knob 99 is released, resiliently to press the film 102 against the upper surface of the mask 41.

In the preferred construction of the invention, the mask 41 is a negative that is printed in reverse, and that is disposed on the plate 39 with its emulsion side up. The photographic film 102 is disposed with its emulsion side down, so that the emulsion coating of the mask 41 is engaged against the unexposed emulsion of the photographic film 102.

A sketch sheet 22, that has been marked by an engineer to indicate a desired circuit layout for a printed wiring card, as shown in FIG. 1, is then placed on the front section of the machine, with the corners of the sheet resting in the supports 21, so that the reproductions 26 of the circular lands on the sketch sheet 22 are in registry with the corresponding buttons 16 on the upper surface of the plate 12 of the machine. The machine is then ready for operation, to reproduce on the photographic film 102 a dimensionally accurate, properly positioned selection of lands for a desired printed wiring card, in accordance with the information on the sketch sheet.

To operate the machine, the toggle switch 59 is closed once and then opened immediately. When the switch 59 is closed, a circuit is made from one terminal of the secondary 66 of the power transformer 67, through the line 68 to the junction 69, through the line 76, the armature of the toggle switch 59, the line 74, the filaments of the bulbs 51', the line 72, the junction 62, and the line 64, back to the other terminal of the transformer secondary 66. The operation of closing and then opening the switch 59 thus energizes all of the light bulbs 51' simultaneously. Since these bulbs 51' are disposed beneath the transparent images 46, 47, and the like, of standard features that are used for all printed wiring cards, this single operation exposed the film 102 in all of the places that correspond to lands and markings that appear on all printed wiring cards.

Next, the stylus handle 56 is grasped, and the point of the rod 58 is forced through the sketch sheet 22 wherever a reproduction 26 of a circular land has been marked by the engineer, to effect an electrical contact between the tip of the rod 58 and the electrical contact button 16 underlying the marked land reproduction 26 on the sketch sheet. The electrical contact between the rod 58 and the contact button 16 completes a circuit from the stylus rod 58 through the line 54, the line 61, the junction 62, the line 64, the transformer secondary 66, the line 68, the junction 69, the line 71, the filament of the single bulb 51 that is electrically connected to the contact button 16, and back through the selected contact button 16 to the rod 58 of the stylus. When the single lamp 51 is energized, light is cast up through the mask, through the particular transparent land image area 42 whose location corresponds to the location of the marked land image 26 on the sketch sheet 22, and the photographic layer 102 is exposed at that one location only, which is automatically properly spaced and oriented relative to the standard markings and standard contact pads and the like that appear on all printed wiring cards.

Use of the stylus 57 is continued until the contact button 16 under each marked land image area 26 on the sketch sheet has been touched with the tip of the rod 58, to expose the film 102 in corresponding locations in accordance with the information on the sketch sheet. If the sketch sheet is then held up to a bright light, there should be a visible, pierced hole through each land reproduction 26 that has been marked by the engineer. This permits a quick check on completeness of the work with the stylus, before the film is developed.

The shield 87 is then reinserted carefully, to protect the exposed film. The frame 79 is removed from the machine, and the exposed film 102 is removed in a dark room. After the exposed film is developed, a positive contact print is obtained that is as accurate dimensionally as is the mask 41.

To carry the preparation of the artwork a step further, black pressure-sensitive tape strips are applied to the positive print, between the land images and other lands or the contact pad images respectively, as necessary to provide highways or interconnection paths for the desired circuit and as indicated on the engineer's sketch sheet 22. In the case where, in the process of producing the cards, only those holes are punched that are actually needed for the particular card being manufactured, the tape strips can be applied directly to the positive without special care other than that of coming too close to other tape strips or lands with which contact should not be made. However, if, in the manufacture of the printed wiring card, a predetermined standard pattern of holes is punched in every card, regardless of whether all the holes are used or not, then the positive preferably is superposed on a sketch sheet or other reproduction of the standard layout of lands, so that the highways will not be disposed across areas that will be punched out when the standard pattern of holes is punched into the card stock.

After the tape has been applied, a contact print 103 (FIG. 7) is made of the taped positive, to produce a reproduction that can be used to make a step and repeat negative for mass production of the particular desired printed wiring card, and that shows black images of the circuit components of the desired card against a white or transparent film background. These black images include, as shown in FIG. 7, highway images 104, land images 105, contact pad images 106, center line marker images 107, pallet hole images 108, and identification indicia.

To minimize the down time of the machine, a plurality of frames 79 can be provided. It is also contemplated, however, that the rear section of the machine, in which the frame 79 fits, can be permanently mounted in the dark room, while the front section of the machine, on which the pattern of contact buttons 16 is mounted, is available elsewhere, such as, for example, in the drafting room. There is no necessity for close proximity between these two parts of the machine, since the electrical wiring between the two sections can be extended over any practical distance desired. It is also contemplated that a plurality of front sections of the machine could be wired to be used with a single rear section of the machine, thus permitting a number of different persons to operate the front sections of the machine respectively, while the rear section could be operated in the dark room by a single operator. To accommodate such an arrangement, a central station is required with an indicator system to indicate to all prospective users of the front section of the machine when the machine was already in use.

To make the use of the machine more convenient, instead of employing a frame containing a single sheet of photographic film, it is possible to modify the machine as shown in FIG. 8, to mount over the rear section of the machine a magazine arrangement for using a roll of film. In this modification of the invention, a film supply roll of photographic film is mounted in a closed cylinder 121 at one end at one side of the machine, and a takeup reel is mounted in the closed cylinder 122 at the other side of the machine. A crank 124 is connected to the takeup reel, to permit transport of the film as necessary. An index mechanism 125 is mounted at one side of the film to indicate when an exposure can be made safely. With this modification of the invention, each time a new circuit is to be reproduced from a sketch sheet, a fresh piece of exposed film is moved over the exposure area beneath the central section 126 of the magazine; and after exposure, the film is wound up on the takeup reel in the cylinder 122.

Light sensitive sheets that are suitable for use in the machine and for making dimensionally accurate and dimensionally stable reproductions, including masks, are those sold, for example, under the trademarks "Cronaflex," a registered trademark of E. I. du Pont de Nemours and Company, Inc., Wilmington, Delaware; and "Stabilene," a registered trademark of Keufel and Esser Company, Buffalo, New York. It is understood that these photographic films each comprise a dimensionally stable film base that is made from a synthetic plastic material and that is coated with a sensitive emulsion.

While photography is preferred because of the simplicity of the technique, and the ready availability of the materials, xerography processes could be employed in practicing this invention, with minor modifications in the structure of the machine, as required by the differences in the techniques. Thus, for example, xerography requires the use of a 1 to 1 reproduction, since xerography at present does not permit precision enlargement and reduction. In contrast, the present system takes advantage of the available precision enlargement and reduction techniques of photography.

The foregoing descriptions apply essentially to a single embodiment of our invention, in which the machine is designed for preparing artwork for printed wiring cards of a standard size, and that can have a predetermined maximum number of lands, all of which are in a predetermined location relative to one another. One underlying principle of the machine is that of using a single, accurate mask for reproducing photographically a large number of different possible land selections for printed wiring cards. We contemplate that this principle can readily be embodied in a larger machine to prepare artwork for cards of different sizes.

The center line markers 18, in FIG. 1, serve only the function of orienting the user of the machine. Since the center line images 47 in the mask 41 are reproduced in every positive print that is made in the machine, the markers 18 need not be placed on the plate 12 as they are in FIG. 1, because they actually serve no mechanical function. However, if a much larger number of buttons 16 are disposed on the plate 12, and the number of land images in the mask 41 is enlarged accordingly, then a plurality of center line markers can be disposed along the two sides and along the top and bottom, respectively, of the plate 12. To permit the user of the machine to reproduce the two pairs of markers that are selected for a desired card size, then, a plurality of different light circuits must be provided, and an increased number of switches like the switch 59, must also be provided. By operating the proper switches, the machine operator can then reproduce any desired pairs of center line markers selectively, to provide datum marks for the land images that are also reproduced. In some cases, the row of contact pads, or some other standard card feature, may serve as the datum marker for some purposes, and in such cases, some choice would be available to permit selection of desired contact pads for reproduction.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention or the limits of the appended claims.

We claim:

1. Apparatus for making reproductions of land layouts for printed wiring cards comprising an opaque mask made from dimensionally stable developed photographic film and that is formed with a plurality of transparent areas that correspond in shape and location to the images of lands that are disposed in a predetermined arrangement to permit the selection of some lands for particular printed wiring cards, a plurality of light sources disposed on one side of said mask to provide a light source in registry with each of said transparent areas, each of said light sources being shielded from other light sources, said mask providing, on the other side thereof, a reverse negative reproduction of said land image arrangement in the emulsion coating of said film providing said transparent areas, means for disposing a dimensionally stable, light sensitive photographic film on said mask with the emulsion of said film engaging the emulsion of said mask, a plurality of separate electrical contact members that are arranged in a positive simulation of said predetermined arrangement of land images, means electrically connecting said members respectively to light sources that are disposed at transparent areas of corresponding respective locations in said arrangement in normally open electrical circuits, said contact members being arranged to permit to be disposed thereover a sketch sheet that has a reproduction thereon of said predetermined arrangement of lands, with said last-named reproduction in registry with said members, and means for piercing said sheet at selected land reproductions to make contact with the members associated therewith and thereby to complete electrical circuits selectively to energize said light sources.

2. Apparatus for making reproductions of land layouts for printed wiring cards comprising an opaque mask comprising a reverse photographic negative reproduction in an emulsion that is coated on one side of a dimensionally stable film base and that is formed with a plurality of transparent areas, some of which correspond in shape and location to the images of lands that are disposed in a predetermined arrangement to permit the selection of certain of said lands for particular wiring cards, and others of which correspond in shape and relative location to the images of standard features that are used on all cards, a plurality of light sources disposed at the uncoated side of said mask, said light sources being disposed in registry with the light-transmitting areas of said mask, respectively, and each of those light sources that is associated with a transparent area that corresponds to a land image being shielded from other light sources, means for disposing a photographic film, comprising a dimensionally stable film base that is coated with a photographic emulsion, with the emulsion side of said photographic film engaging the emulsion side of said mask, a plurality of electrical contact members that are arranged in a positive simulation of said predetermined arrangement of land images, means electrically connecting said members respectively to those light sources that are disposed at transparent areas that correspond to land images and that are of corresponding respective locations in said arrangement in normally open electrical circuits, an electrical switch, means electrically connecting those light sources that are disposed at transparent areas that correspond to standard card features with said switch, to permit simultaneous actuation of said last-named light sources upon operation of said switch, said contact members being arranged to permit to be disposed thereover a sketch sheet that has a reproduction of said predetermined arrangement of lands, with said last-named reproduction in registry with said members, and means for piercing said sheet at selected land reproductions to make contact with the members associated therewith and thereby to complete electrical circuits selectively to energize said light sources that are associated with the land images of said mask.

3. Apparatus for making reproductions of substantially two-dimensional objects with some standard features and with some of a number of differentiating features, respectively, that can be disposed in said reproduction at a corresponding number of locations in each reproduction, comprising a mask that is formed with a plurality of light-transmitting areas, some of which correspond to standard features and the others of which correspond to said differentiating features, respectively, the areas that correspond to said differentiating features being disposed in predetermined locations relative to the areas that correspond to said standard features, the remainder of said mask being opaque, a plurality of light sources disposed at one side of said mask, said light sources being disposed in registry with light-transmitting areas of said mask respectively, each of those light sources that is associated with a light-transmitting area that corresponds to a differentiating feature being shielded from other light sources, means for disposing a light-sensitive photographic layer on the other side of said mask in position to be exposed to light that is transmitted through said areas, a group of electrical contact members arranged to correspond to the locations of the areas in said mask that correspond to said differentiating features, means connecting each of said light sources that is disposed at a light-transmitting area that corresponds to one of said differentiating features respectively with the corresponding one of said electrical contact members in a normally-open electrical circuit, said group of electrical contact members being arranged to permit to be superposed thereon a template in the form of a sheet of paper having indicia printed thereon in a predetermined pattern indicating all possible locations of said differentiating features, with the template indicia in registry with said contact members, a pointed stylus that can be used to pierce the paper template at each of the locations in said pattern corresponding to a desired differentiating feature, to make electrical contact with the appropriate electrical contact member corresponding to the pierced portion of said sheet of paper to permit selective, separate completion of said circuits thereby to permit separate and selective actuation of the light sources in said circuits respectively, and means for actuating the light sources that are associated with the light-transmitting areas that correspond to standard features.

4. Apparatus for making reproductions of substantially two-dimensional objects with some standard features and with some of a number of differentiating features, respectively, in a desired predetermined relative spatial relation, comprising a mask that is formed with a plurality of light-transmitting image areas, some of which correspond to said standard features and others of which correspond to said differentiating features, respectively, all of said image areas being disposed in predetermined, substantially dimensionally accurate locations relative to each other, the remainder of said mask being opaque, a plurality of light sources disposed at one side of said mask, said light sources being disposed in registry with light-transmitting image areas of said mask respectively in association with said image areas respectively, means shielding each of said light sources from image areas with which it is not associated, means for disposing a light-sensitive layer on the other side of said mask in position to be exposed to light that is transmitted through said image areas, a group of electrical contact members arranged in a predetermined pattern in which the locations of said members correspond respectively to the locations of the areas of said mask that correspond to said differentiating features, means connecting each of said light sources that is disposed at an image area that corresponds to one of said differentiating features respectively with the correspondingly located one of said electrical contact members in a normally-open electrical circuit, a template having indicia disposed thereon at locations that correspond to the locations of the desired differentiating features at the same scale as said arrangement of contact members, said group of electrical contact members oriented in cooperative relationship with said template to be superposed thereon with said indicia in registry with the corresponding contact members, means for cooperating with said template and with said contact members to permit selective completion of said circuits separately, to permit separate and selective actuation of the light sources in said circuits respectively, and means for actuating the light sources that are associated with the light-transmitting areas that correspond to standard features, to permit reproduction in said layer of said standard features and of a plurality of said differentiating features, respectively, in said desired spatial relation.

5. Apparatus in accordance with claim 4 wherein said template is in the form of a sheet of paper, and in which said means for cooperating with said template and with said contact members to permit selective completion of said circuits separately comprises a pointed stylus that can be used to pierce said paper at the location in said pattern corresponding to a desired differentiating feature, to make electrical contact with the appropriate electrical contact member corresponding to the pierced portion of said sheet of paper.

6. Apparatus for use in the mass production of printed wiring cards for making reproductions of land layouts for the printed wiring cards wherein the land locations of each printed wiring card are selected from a standard pattern of land locations and wherein only those lands that are needed for a particular card are used on that card, comprising a mask that comprises a negative reproduction of a printed wiring card having a plurality of transparent image areas formed therein that correspond in shape and location to the images of lands that are disposed at all of the locations in said standard pattern, and having another transparent image area formed therein that represents a datum marker that is disposed in a predetermined spatial location relative to said standard pattern of land locations and that is to be formed on all printed wiring cards, a plurality of light sources disposed on one side of said mask to provide a light source in registry with each of said transparent areas, each of said light sources being shielded from other light sources, an article having a light-sensitive layer in which a reproduction is to be made, means for supporting an assembly of said mask and said article in position for reproducing portions of said mask in said light-sensitive layer, upon exposure to light from said light sources through said mask, a group of electrical contact members arranged in a predetermined pattern in which the locations of said members correspond respectively to the locations of the image areas of said mask that correspond to the lands in said standard pattern of land locations, means connecting each of said light sources that is disposed at an image area that corresponds to one of said land locations respectively with the correspondingly located one of said electrical contact members in a normally-open electrical circuit, means in said circuits for cooperating with said contact members to permit selective, separate completion of said circuits, thereby to permit selective, separate actuation of the light sources that are associated with the land location image areas respectively, and means for actuating the light source that is associated with the datum marker image area, to permit reproduction in said layer of said datum marker and of lands corresponding to the lands that are needed for the particular card.

7. Apparatus for use in the mass production of printed wiring cards for making reproductions of land layouts for the printed wiring cards wherein the land locations of each printed wiring card are selected from a standard pattern of land locations and wherein only those lands that are needed for a particular card are used on that card, comprising a mask that is formed with a plurality of light-transmitting image areas, some of which represent lands that are disposed at all of the locations in said standard pattern, and others of which represent standard features including a datum marker that are to be formed on all printed wiring cards, all of said image areas being disposed in predetermined, substantially dimensionally accurate locations relative to each other, the remainder of said mask being opaque, a plurality of light sources disposed at one side of said mask, said light sources being disposed in registry with image areas of said mask respectively in association with said image areas respectively, means shielding each of said light sources from image areas with which it is not associated, means for disposing a light-sensitive photographic layer on the other side of said mask in position to be exposed to light that is transmitted through said image areas, a group of electrical contact members arranged in a predetermined pattern that is a positive simulation of the standard pattern of land locations, means connecting each of said light sources that is disposed at a land location image respectively with the correspondingly located one of said electrical contact members in a normally-open electrical circuit, a template having indicia disposed thereon at locations that correspond to the locations of the desired lands that are needed for a particular card at the same scale as said arrangement of contact members, said group of electrical contact members being arranged to permit said template to be superposed thereon with said indicia in registry with the corresponding contact members, means for cooperating with said template and with said contact members to permit selective completion of said circuits separately, to permit selective, separate actuation of the light sources in said circuits respectively, and means for actuating the light sources that are associated with the standard feature image areas, to permit reproduction in said layer of said standard features and of a plurality of lands that correspond to the lands that are needed for the particular card, respectively.

8. Apparatus for use in the mass production of printed wiring cards for making reproductions of land layouts for the printed wiring cards wherein the land locations of each printed wiring card are selected from a standard pattern of land locations and wherein only those lands that are needed for a particular card are used on that card, comprising a mask that is formed with a plurality of light-transmitting image areas, some of which represent lands that are disposed at all of the locations in said standard pattern, and others of which represent standard features including a datum marker that are to be formed on all printed wiring cards, all of said image areas being disposed in predetermined, substantially dimensionally accurate locations relative to each other, the remainder of said mask being opaque, a plurality of light sources disposed at one side of said mask, said light sources being disposed in registry with image areas of said mask respectively in association with said image areas respectively, means shielding each of said light sources from image areas with which it is not associated, means for disposing a light-sensitive photographic layer on the other side of said mask in position to be exposed to light that is transmitted through said image areas, a group of electrical contact members arranged in a predetermined pattern that is a similar simulation of the standard pattern of land locations, means connecting each of said light sources that is disposed at a land location image respectively with the correspondingly located one of said electrical contact members in a normally-open electrical circuit, a template having indicia disposed thereon at locations that correspond to the locations of the desired lands that are needed for a particular card at the same scale as said arrangement of contact members, said group of electrical contact members being oriented in cooperative relationship with said template to be superimposed thereon with said indicia in registry with the corresponding contact members, means for cooperating with said template and with said contact members to permit selective completion of said circuits separately, to permit selective, separate actuation of the light sources in said circuits respectively, and means for actuating the light sources that are associated with the standard feature image areas, to permit reproduction in said layer of said standard features and of a plurality of lands that correspond to the lands that are needed for the particular card, respectively.

References Cited in the file of this patent

UNITED STATES PATENTS

| | | |
|---|---|---|
| 1,729,783 | Kaiser | Oct. 1, 1929 |
| 1,736,445 | Jannenga | Nov. 19, 1929 |
| 1,742,372 | Taylor | Jan. 7, 1930 |
| 2,752,245 | Hough | June 26, 1956 |
| 2,821,124 | Enright | Jan. 28, 1958 |
| 2,827,826 | Dale | Mar. 25, 1958 |